US011604971B2

(12) United States Patent
Park et al.

(10) Patent No.: US 11,604,971 B2
(45) Date of Patent: Mar. 14, 2023

(54) NEUROMORPHIC APPARATUS HAVING 3D STACKED SYNAPTIC STRUCTURE AND MEMORY DEVICE HAVING THE SAME

(71) Applicant: SAMSUNG ELECTRONICS CO., LTD., Suwon-si (KR)

(72) Inventors: Jaechul Park, Yongin-si (KR); Sangwook Kim, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 866 days.

(21) Appl. No.: 16/414,257

(22) Filed: May 16, 2019

(65) Prior Publication Data
US 2019/0354843 A1 Nov. 21, 2019

Related U.S. Application Data

(60) Provisional application No. 62/672,271, filed on May 16, 2018.

(30) Foreign Application Priority Data

Aug. 13, 2018 (KR) ........................ 10-2018-0094616

(51) Int. Cl.
*G06N 3/063* (2006.01)
*H01L 25/065* (2006.01)
*G11C 13/00* (2006.01)

(52) U.S. Cl.
CPC ............ *G06N 3/063* (2013.01); *G11C 13/003* (2013.01); *G11C 13/0023* (2013.01); *H01L 25/0657* (2013.01)

(58) Field of Classification Search
CPC .. G06N 3/063; G06N 3/0635; G11C 13/0023; G11C 13/003; G11C 2213/77; G11C 11/22; G11C 11/54; H01L 25/0657
See application file for complete search history.

(56) References Cited

U.S. PATENT DOCUMENTS 6,952,030 B2 10/2005 Herner et al.
7,586,773 B2 9/2009 Herner
(Continued)

FOREIGN PATENT DOCUMENTS

KR 10-1468521 B1 12/2014
KR 10-1783086 B1 9/2017

OTHER PUBLICATIONS

Kuzum, Duygu et al., "Synaptic electronics: materials, devices and applications", Nanotechnology, 2013, vol. 24, pp. 1-22. (23 pages total).

(Continued)

*Primary Examiner* — Ajay Ojha

(57) ABSTRACT

A neuromorphic apparatus includes a three-dimensionally-stacked synaptic structure, and includes a plurality of unit synaptic modules, each of the plurality of unit synaptic modules including a plurality of synaptic layers, each of the plurality of synaptic layers including a plurality of stacked layers, and each of the plurality of unit synaptic modules further including a first decoder interposed between two among the plurality of synaptic layers. The neuromorphic apparatus further includes a second decoder that provides a level selection signal to the first decoder included in one among the plurality of unit synaptic modules to be accessed, and a third decoder that generates an address of one among a plurality of memristers to be accessed in a memrister array of one among the plurality of synaptic layers included in the one among the plurality of unit synaptic modules to be accessed.

20 Claims, 13 Drawing Sheets

<BIOLOGICAL NEURON>

<MATHEMATIC MODEL OF BIOLOGICAL NEURON>

(56) References Cited

U.S. PATENT DOCUMENTS

| | | |
|---|---|---|
| 8,565,003 B2 | 10/2013 | Siau |
| 8,605,483 B2 | 12/2013 | Williams et al. |
| 8,724,369 B2 | 5/2014 | Zhang et al. |
| 9,224,949 B2 | 12/2015 | Yang et al. |
| 9,941,299 B1 | 4/2018 | Chen et al. |
| 2018/0165573 A1* | 6/2018 | Hsu .................. G06N 3/0454 |
| 2019/0318230 A1* | 10/2019 | Cho .................. G06N 3/063 |

OTHER PUBLICATIONS

Yu, Shimeng, "Neuro-Inspired Computing With Emerging Non-volatile Memory", Proceedings of the IEEE, Feb. 2018, vol. 106, No. 2, pp. 260-285. (26 pages total).

* cited by examiner

NEUROMORPHIC APPARATUS HAVING 3D STACKED SYNAPTIC STRUCTURE AND MEMORY DEVICE HAVING THE SAME

CROSS-REFERENCE TO RELATED APPLICATIONS

This application claims the benefit of U.S. Provisional Application No. 62/672,271, filed on May 16, 2018, in the U.S. Patent and Trademark Office, and priority from Korean Patent Application No. 10-2018-0094616, filed on Aug. 13, 2018, in the Korean Intellectual Property Office, the disclosures of which are incorporated herein by reference in their entireties.

BACKGROUND

1. Field

Apparatuses and methods consistent with example embodiments relate to neuromorphic apparatuses having a synaptic structure in which a plurality of memristor arrays are three-dimensionally (3D) stacked.

2. Description of the Related Art

Interests in an neuromorphic processor that resembles a human nervous system have been increased. Studies have been conducted to realize an neuromorphic processor by designing a neuron circuit and a synaptic circuit respectively corresponding to a neuron and a synapse that are present in a human nervous system. The neuromorphic processor may be used for driving various neural networks, such as a Convolutional Neural Network (CNN), a Recurrent Neural Network (RNN), or a Feedforward Neural Network (FNN), and may be used in fields of data classification or image recognition.

SUMMARY

Provided are neuromorphic processors having a 3D a three-dimensionally stacked synaptic structure and a memory device including the same. The present disclosure is not limited to the technical aspects as described above, and other technical aspects can be inferred from the following examples.

Additional aspects will be set forth in part in the description which follows and, in part, will be apparent from the description, or may be learned by practice of the presented embodiments.

According to an aspect of an example embodiment, there is provided a neuromorphic apparatus including a three-dimensionally-stacked synaptic structure, the neuromorphic apparatus including a plurality of unit synaptic modules, each of the plurality of unit synaptic modules including a plurality of synaptic layers, each of the plurality of synaptic layers including a plurality of stacked layers, and each of the plurality of unit synaptic modules further including a first decoder interposed between two among the plurality of synaptic layers. The neuromorphic apparatus further includes a second decoder that provides a level selection signal to the first decoder included in one among the plurality of unit synaptic modules to be accessed, and a third decoder that generates an address of one among a plurality of memristors to be accessed in a memristor array of one among the plurality of synaptic layers included in the one among the plurality of unit synaptic modules to be accessed.

In each of the plurality of unit synaptic modules, neighboring memristers included in neighboring synaptic layers have a plurality of stack structures symmetrical to each other.

Each of the plurality of unit synaptic modules may include a first synaptic layer including a first array of first memristers, each of the first memristers having a first stack structure, a second synaptic layer disposed on the first synaptic layer, and including a second array of second memristers, each of the second memristers having a second stack structure, a third synaptic layer including a third array of third memristers, each of the third memristers having the first stack structure, and a fourth synaptic layer disposed on the third synaptic layer, and including a fourth array of fourth memristers, each of the fourth memristers having the second stack structure. The first decoder may be interposed between the second synaptic layer and the third synaptic layer.

A lower synaptic layer of the neighboring synaptic layers may include a first array of first memristers, each of the first memristers having a first stack structure. An upper synaptic layer of the neighboring synaptic layers may include a second array of second memristers, each of the second memristers having a second stack structure. Each of the first memristers having the first stack structure may include a first memory cell, the first memory cell including a first metal, a ferroelectric disposed on the first metal, an insulator disposed on the ferroelectric, and a second metal disposed on the ferroelectric. Each of the second memristers having the second stack structure may include a second memory cell, the second memory cell including the second metal, the insulator disposed on the second metal, the ferroelectric disposed on the insulator, and the first metal disposed on the ferroelectric.

The lower synaptic layer may include a first word line on which the first array of the first memristers is disposed, and a first bit line disposed on the first array of the first memristers. The upper synaptic layer may include the first bit line on which the second array of the second memristers is disposed, and a second word line disposed on the second array of the second memristers.

The first bit line may correspond to an axon of a neural network. The first word line and the second word line may respectively correspond to dendrites of the neural network.

A first potential barrier height between the second metal and the insulator may be greater than a second potential barrier height between the first metal and the ferroelectric.

A first dielectric constant of the insulator may be less than a second dielectric constant of the ferroelectric.

The first metal may be one selected from a group consisting of TiN, Al, Zr, La, Y, Ti, and W. The second metal may be one selected from a group consisting of TiN, Al, Zr, La, Y, Ti, and W. The insulator may be one selected from a group consisting of $Al_2O_3$, $SiO_2$, and $Si_3N_4$. The ferroelectric may be HfO doped with any one or any combination of Si, Zr, Y, Al, Gd, Sr, and La.

The plurality of unit synaptic modules may be disposed on the third decoder.

The third decoder may generate a row line signal and a column line signal that correspond to the address of the one among the plurality of memristers.

The level selection signal may be for selecting the one among the plurality of unit synaptic modules to be accessed and the one among the plurality of synaptic layers to be accessed.

According to an aspect of an example embodiment, there is provided a memory device having a three-dimensionally-stacked synaptic structure, the memory device including a plurality of unit memory modules, each of the plurality of unit memory modules including a plurality of memory layers, each of the plurality of memory layers including a plurality of stacked layers, and each of the plurality of unit memory modules further including a first decoder interposed between two among of the plurality of memory layers. The memory device further includes a second decoder that provides a level selection signal to the first decoder included in one among the plurality of unit memory modules to be accessed, and a third decoder that generates an address of one among a plurality of memory cells to be accessed in a memory cell array of one among the plurality of memory layers included in in the one among the plurality of unit memory modules to be accessed. In each of the plurality of unit memory modules, neighboring memory cells included in neighboring memory layers have a plurality of stack structures symmetrical to each other.

Each of the plurality of unit memory modules may include a first memory layer including a first array of first memory cells, each of the first memory cells having a first stack structure, a second memory layer disposed on the first memory cells, and including a second array of second memory cells, each of the second memory cells having a second stack structure, a third memory layer including a third array of third memory cells, each of the third memory cells having the first stack structure, and a fourth memory layer disposed on the third memory layer, and including a fourth array of fourth memory cells, each of the fourth memory cells having the second stack structure. The first decoder may be interposed between the second memory layer and the third memory layer.

A lower memory layer of the neighboring memory layers may include a first array of first memory cells, each of the first memory cells having a first stack structure. An upper memory layer of the neighboring memory layers may include a second array of second memory cells, each of the second memory cells having a second stack structure. Each of the first memory cells having the first stack structure may include a first metal, a ferroelectric disposed on the first metal, an insulator disposed on the ferroelectric, and a second metal disposed on the ferroelectric. Each of the second memory cells having the second stack structure may include the second metal, the insulator disposed on the second metal, the ferroelectric disposed on the insulator, and the first metal disposed on the ferroelectric.

The lower memory layer may include a first word line on which the first array of the first memory cells is disposed, and a first bit line disposed on the first array of the first memory cells. The upper memory layer may include the first bit line on which the second array of the second memory cells is disposed, and a second word line disposed on the second array of the second memory cells.

A first potential barrier height between the second metal and the insulator may be greater than a second potential barrier height between the first metal and the ferroelectric. A first dielectric constant of the insulator may be less than a second dielectric constant of the ferroelectric.

According to an aspect of an example embodiment, there is provided a method of operating a neuromorphic apparatus having a three-dimensionally-stacked synaptic structure, the method including providing a level selection signal to a first decoder included in one among a plurality of unit synaptic modules to be accessed, each of the plurality of unit synaptic modules including a plurality of synaptic layers, each of the plurality of synaptic layers including a plurality of stacked layers, and each of the plurality of unit synaptic modules further including the first decoder interposed between two among the plurality of synaptic layers. The method further includes generating an address of one among a plurality of memristers to be accessed in a memrister array of one among the plurality of synaptic layers included in the one among the plurality of unit synaptic modules to which the level selection signal is provided, and accessing to the one among the plurality of memristers corresponding to the generated address. In each of the plurality of unit synaptic modules, neighboring memristers included in neighboring synaptic layers have a plurality of stack structures symmetrical to each other.

According to an aspect of an example embodiment, there is provided a synaptic module of a neuromorphic apparatus having a three-dimensionally-stacked synaptic structure, the synaptic module including a first synaptic layer including a first array of first memristers, each of the first memristers having a first stack structure, and the first synaptic layer further including a first word line on which the first array of the first memristers is disposed, and a first bit line disposed on the first array of the first memristers. The synaptic module further includes a second synaptic layer disposed on the first synaptic layer, and including a second array of second memristers, each of the second memristers having a second stack structure, the second synaptic layer further including the first bit line on which the second array of the second memristers is disposed, and a second word line disposed on the second array of the second memristers. Each of the first memristers having the first stack structure includes a first memory cell, the first memory cell including a first metal, a ferroelectric disposed on the first metal, an insulator disposed on the ferroelectric, and a second metal disposed on the ferroelectric. Each of the second memristers having the second stack structure includes a second memory cell, the second memory cell including the second metal, the insulator disposed on the second metal, the ferroelectric disposed on the insulator, and the first metal disposed on the ferroelectric.

A first potential barrier height between the second metal and the insulator may be greater than a second potential barrier height between the first metal and the ferroelectric. A first dielectric constant of the insulator may be less than a second dielectric constant of the ferroelectric.

The neuromorphic apparatus may include a plurality of unit synaptic modules. Each of the plurality of unit synaptic modules may include a first synaptic module having a structure of the synaptic module, a first decoder for selecting one of the plurality of unit synaptic modules, and a second synaptic module having the structure of the synaptic module. The first decoder may be interposed between the first synaptic module and the second synaptic module.

BRIEF DESCRIPTION OF THE DRAWINGS

The above and/or other aspects will become apparent and more readily appreciated from the following description of example embodiments, taken in conjunction with the accompanying drawings in which.

and

Figure 12:
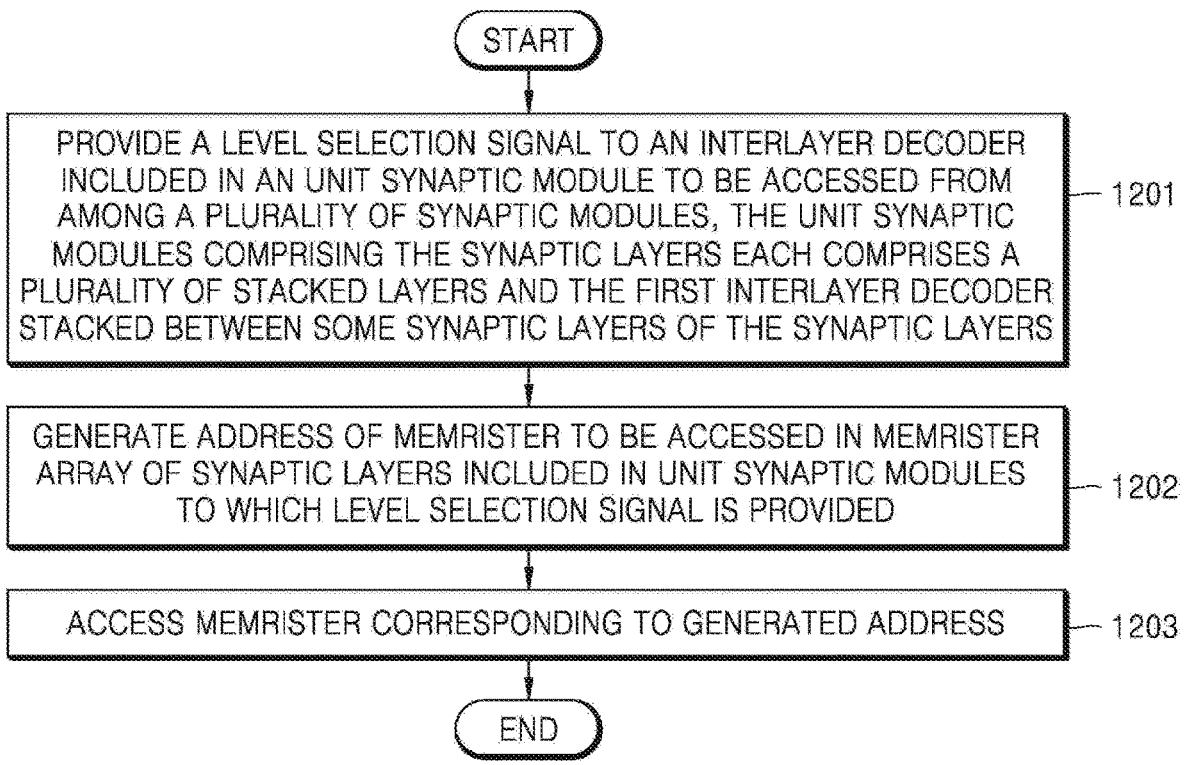

FIG. 12 is a flowchart of a method of operating a neuromorphic apparatus having a 3D stacked synaptic structure according to an example embodiment.

DETAILED DESCRIPTION

All terms including descriptive or technical terms that are used herein may be construed as having meanings that are obvious to one of ordinary skill in the art. However, the terms may have different meanings according to the intention of one of ordinary skill in the art, precedent cases, or the appearance of new technologies. Also, some terms may be arbitrarily selected by the applicant, and in this case, the meaning of the selected terms will be described in detail in the detailed description of the disclosure. Thus, the terms used herein have to be defined based on the meaning of the terms together with the description throughout the specification.

In the specification, when a region is "connected" to another region, the regions may not only be "directly connected," but may also be "electrically connected" via another device therebetween. Also, when a region "includes" an element, the region may further include another element instead of excluding the other element, unless otherwise differently stated.

The terms "includes" or "comprises" used in the specification may not be interpreted as necessarily including all components or operations described herein, and some components or operations may not be included or additional components or operations may be further included.

It will be understood that, although the terms 'first', 'second', etc. may be used herein to describe various constituent elements, these constituent elements may not be limited by these terms. These terms are only used to distinguish one constituent element from another.

Example embodiments will now be described in detail with reference to the accompanying drawings, wherein like reference numerals refer to like elements throughout. In this regard, the present embodiments may have different forms and may not be construed as being limited to the descriptions set forth herein.

Figure 1:
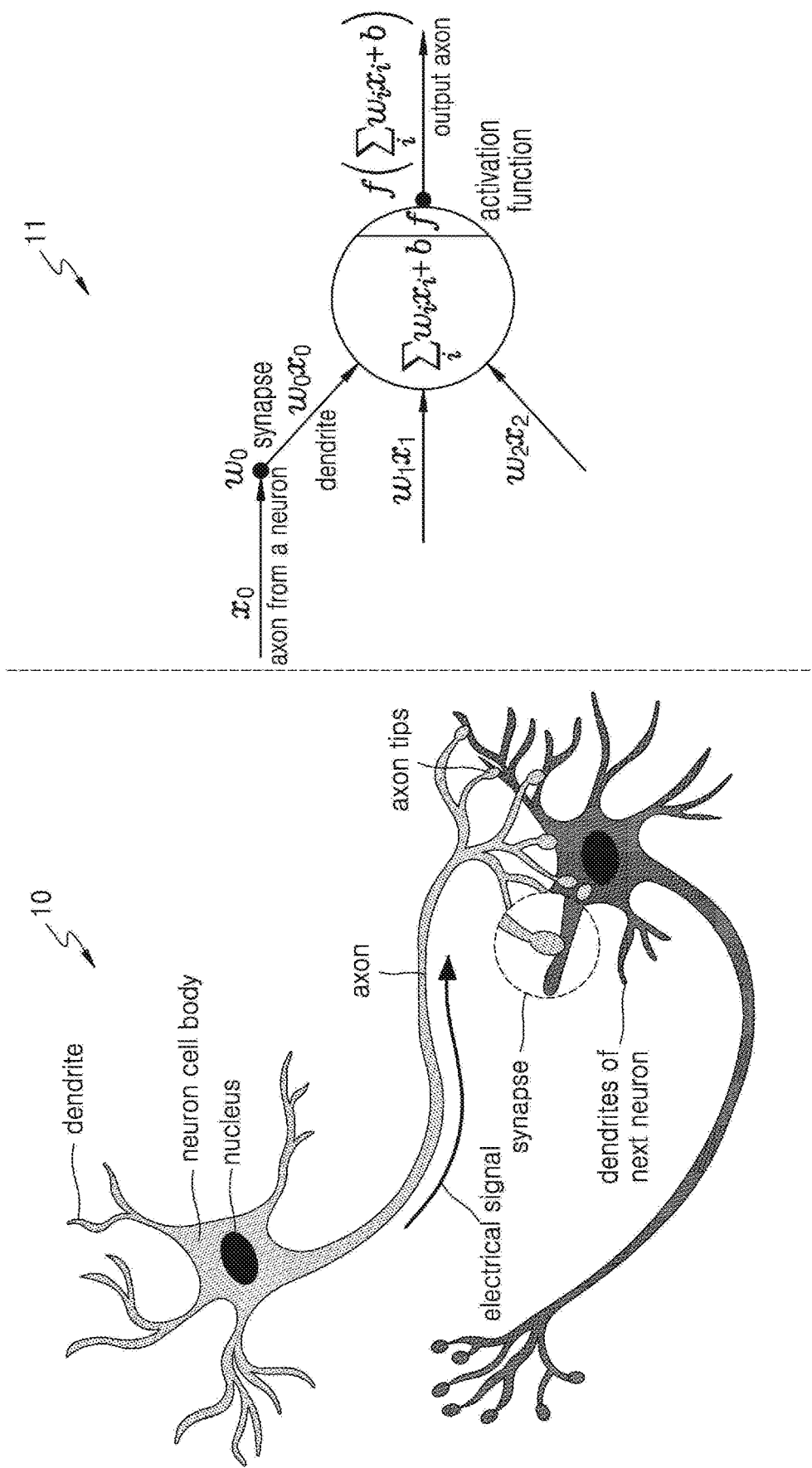
FIG. 1 is a diagram for explaining a biological neuron and a mathematical model that imitates the biological neuron.

FIG. 1 is a diagram for explaining a biological neuron and a mathematical model that mimics the biological neuron.

A neurons denotes a type of cell in a human nervous system. A neuron is one of basic biological computation bodies. A human brain contains approximately 100 billion ($10^{11}$) neurons and approximately 100 trillion ($10^{14}$) interconnects between the neurons.

Referring to FIG. 1, a biological neuron 10 is a single cell. The biological neuron 10 includes a neuron cell body that includes a nucleus and various organelles. The various organelles include a mitochondria, a plurality of dendrites emitted from a cell body, and an axon that crosses a lot of branch extensions.

The axon performs a function of transmitting signals from a neuron to another neuron, and the dendrite performs a function of receiving signals from other neurons. For example, when neurons are connected to each other, a signal transmitted through an axon of a neuron may be received by a dendrite of another neuron. At this point, a signal between the neurons is transmitted through a specialized connection that is referred to as a synapse, and a neural network is formed by connecting a lot of neurons. On a basis of the synapse, a neuron that secrets a neurotransmitter may be referred to as a pre-synaptic neuron, and a neuron that receives information transmitted through the neurotransmitter may be referred to as a post-synaptic neuron.

A human brain may learn and memorize a large amount of information by transmitting and processing various signals through a neural network formed by a large number of neurons connected to each other. The vast connections between the neurons in the human brain are directly related to a massively parallel nature of a biological computation. Thus, various attempts for efficiently processing a large number of information have been conducted by imitating an artificial neural network. For example, studies have been conducted about a neuromorphic processor as a computing system designed for realizing an artificial neural network at a level of a neuron.

The biological neuron 10 may be imitated as a mathematical model 11. The mathematical model 11 corresponding to the biological neuron 10 may be an example of a neuromorphic operation in which a synapse weight is multiplied with respect to information from a plurality of neurons, an addition operation $\Sigma$ is performed with respect to values $\omega_0 x_0$, $\omega_1 x_1$, and $\omega_2 x_2$ to which the synapse weight is multiplied. Furthermore, operations are performed using a characteristic function band an active function f with respect to a result of the addition operation, and in this way, a result of a neuromorphic operation may be provided. Here, the values $x_0$, $x_1$, and $x_2$ may correspond to axon values and the $\omega_0 x_0$, $\omega_1 x_1$, and $\omega_2 x_2$ may correspond to synapses values.

Figure 2:
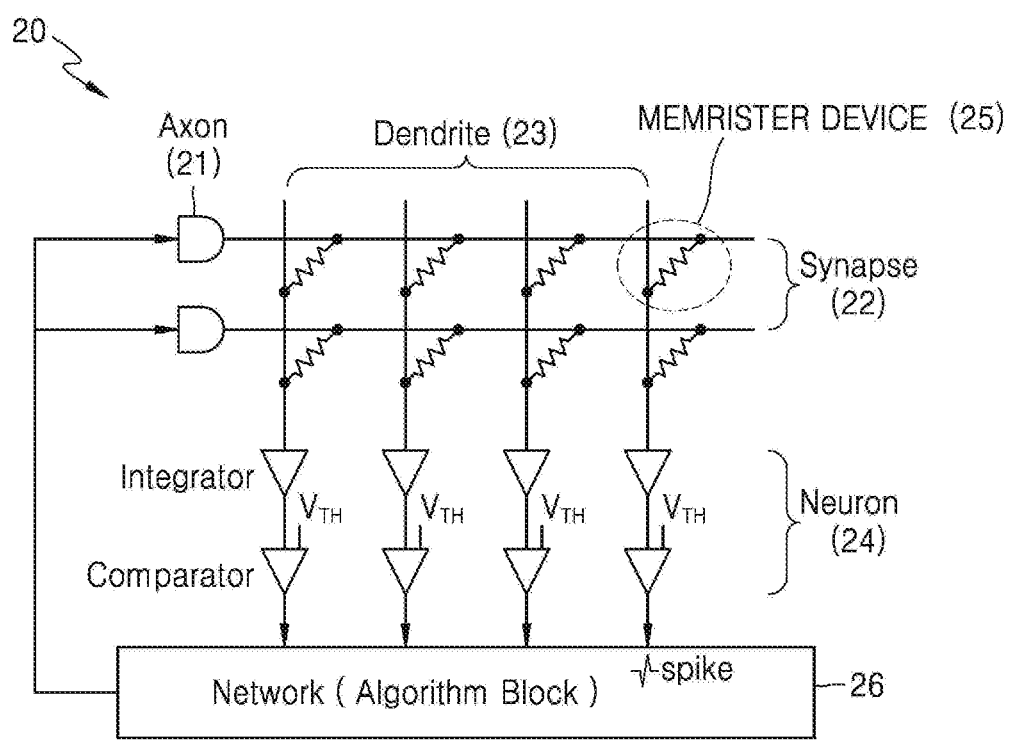
FIG. 2 is a diagram for explaining a configuration of a two-dimensional (2D) array circuit of a neuromorphic apparatus according to an example embodiment.

FIG. 2 is a diagram for explaining a configuration of a two-dimensional (2D) array circuit of a neuromorphic apparatus 20 according to an example embodiment.

Referring to FIG. 2, the configuration of the 2D array circuit of the neuromorphic apparatus 20 is depicted. The neuromorphic apparatus 20 includes axon circuits 21, synapse circuits 22, dendrite circuits 23, neuron circuits 24 and a network 26. The neuromorphic apparatus 20 may include first direction lines (or axon lines) extending in a first direction from the axon circuits 21 and second direction lines (or dendrite lines) corresponding to the dendrite circuits 23. The first direction lines and the second direction lines may cross each other, and the synapse circuits 22 may be disposed on crossing points of the first and second direction lines. Referring to FIG. 2, it is depicted as an example that the first direction is a row direction and the second direction is a column direction, but the directions are not limited thereto.

Each of the axon circuits 21 may denote a circuit imitating an axon of the biological neuron 10 (refer to FIG. 1). The axon of the neuron performs a function of transmitting signals of a neuron to other neurons, and thus, each of the axon circuits 21 that imitate an axon of a neuron may receive an activation and transmit it to the first direction lines. The activation corresponds to a neurotransmitter transmitted through a neuron, and may denote an electrical signal inputted to each of the axon circuits 21. The axon circuits 21 respectively may include a memory or a register that stores input information.

The synapse circuits 22 respectively may denote a circuit that imitates a synapse between neurons. The synapse circuits 22 may store a weight corresponding to a connection strength between the neurons. The synapse circuits 22 respectively may include a memory device for storing a weight or may be connected to a memory device that stores a weight. Here, the memory device described above may correspond to a memristor.

The dendrite circuits 23 may denote circuits that imitate dendrites of a neuron. The dendrite circuits 23 may perform a function of receiving a signal from other external neuron, and may provide a weight and an operation result of an activation to each of the neuron circuits 24 through the second direction lines. The neuron circuits 24 respectively may determine whether to output a spike or not based on the operation result received through the corresponding second direction lines. For example, the neuron circuits 24 respectively may output a spike when an accumulated value of the received operation results is greater than a value set in advance. Spikes outputted from the neuron circuits 24 may correspond to activations inputted to the axons of the next layer through the network 26.

The neuron circuits 24 are located on a rear line based on the synapse circuits 22, and thus, may be referred to as post-synaptic neuron circuits, and the axon circuits 21 are located on a front line based on the synapse circuits 22, and thus, may be referred to as pre-synaptic neuron circuits.

The synapse circuits 22 respectively may be realized as memory devices like memristor devices 25. Each of the memristor device 25 may be a device in which weights are stored through a memristor-based design and a multiplying operation (that is, an AND operation) is performed at a crossing point. The memristor device 25 of each of the synapse circuits 22 according to the present example embodiment may be realized in a method of a ferroelectric tunnel junction (FTJ) memory by using a ferroelectric, which will be described below in detail with reference to the corresponding drawings.

Figure 3:
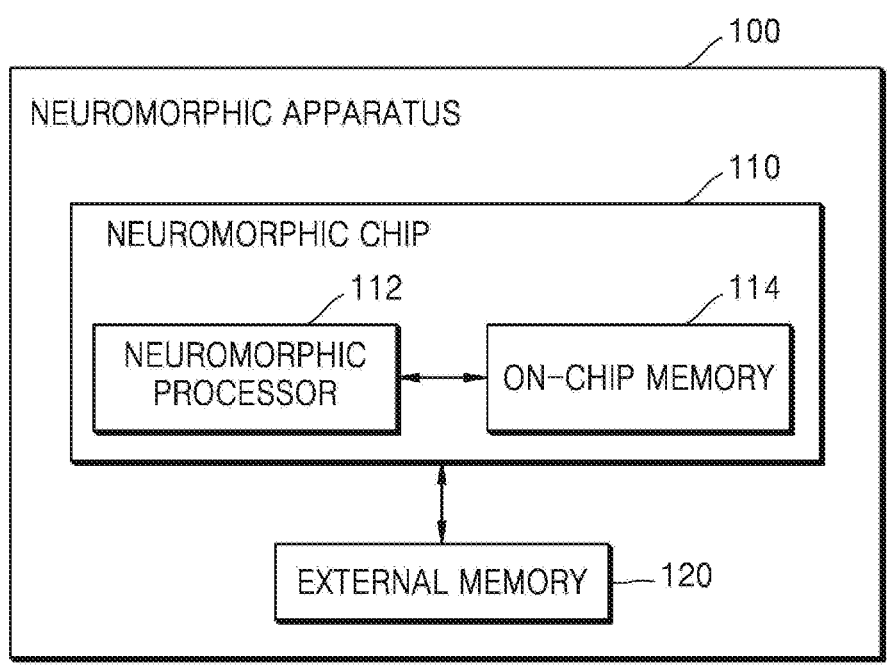
FIG. 3 is a block diagram for explaining a configuration of hardware of a neuromorphic apparatus according to an example embodiment.

FIG. 3 is a block diagram for explaining a configuration of hardware of a neuromorphic apparatus 100 according to an example embodiment.

Referring to FIG. 3, the neuromorphic apparatus 100 includes a neuromorphic chip 110 including a neuromorphic processor 112 and an on-chip memory 114 and an external memory 120. However, the neuromorphic apparatus 100 of FIG. 3 includes only constituent elements that are related the present example embodiment. Accordingly, it will be obvious by those of ordinary skill in the art that the neuromorphic apparatus 100 may further include other constituent elements, for example, a central processing unit (CPU), a graphics processing unit (GPU), an application processor (AP), a sensing module, a communication module, etc. besides the constituent elements depicted in FIG. 3.

The neuromorphic apparatus 100 may be a device included in various electronic devices, for example, a personal computer (PC), a server device, a mobile device, an embedded device, etc. The neuromorphic apparatus 100 may correspond to a hardware configuration included in a device that performs voice recognition, image recognition, and image classification by using a neural network. The device may include, for example, a smart phone, a tablet device, an augmented reality (AR) device, an Internet of Things (IoT) device, an autonomous vehicle, a robotics, a medical equipment, etc. That is, the neuromorphic apparatus 100 may correspond to an exclusive hardware (HW) accelerator mounted on the devices described above. Also, the neuromorphic apparatus 100 may be a hardware accelerator, such as a neural processing unit (NPU), a Tensor Processing Unit (TPU), an Neural Engine, etc., which are an exclusive module for driving a neural network, but the present embodiment is not limited thereto.

The neuromorphic chip 110 controls overall functions for driving the neural network in the neuromorphic apparatus 100. For example, the neuromorphic processor 112 of the neuromorphic chip 110 controls the neuromorphic apparatus 100 by accessing neuromorphic data (for example, axon values, or synaptic values) stored in the external memory 120 in the neuromorphic apparatus 100 and by executing programs related to the neuromorphic. The neuromorphic chip 110 may drive the neural network according to the control of a CPU, a GPU, an AP, etc. that are internally or externally included in the neuromorphic apparatus 100.

The external memory 120 is hardware that stores various neuromorphic data that are processed in the neuromorphic chip 110, and may store data processed or to be processed in the neuromorphic chip 110. Also, the external memory 120 may include applications or drivers to be driven by the neuromorphic chip 110. The external memory 120 may include a random access memory (RAM), such as a dynamic random access memory (DRAM) and a static random access memory (SRAM), a read-only memory (ROM), an electrically erasable programmable read-only memory (EEPROM), a CD-ROM, a blu-ray or other optical disc storages, a hard disk drive (HDD), or a solid state drive (SSD).

The on-chip memory 114 of the neuromorphic chip 110 may lead and store (or buffer) neuromorphic data, for example, axon values or synaptic values for pre-synaptic neuron circuits from the external memory 120, and may execute a neural network by using the stored neuromorphic data. Also, the on-chip memory 114 may store data for post-synaptic neuron circuits, such as neuron values or spike values that are generated as a result of executing the neural network.

Figure 4A:
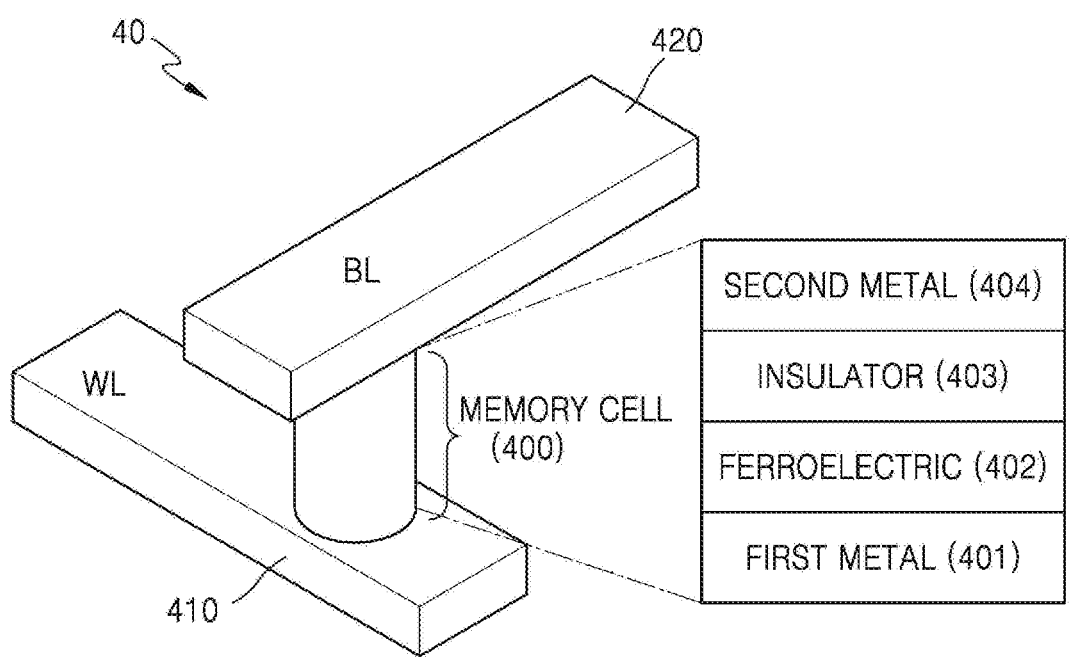
FIG. 4A is a diagram for explaining a structure of a single memory cell corresponding to a single memristor device according to an example embodiment.

FIG. 4A is a diagram for explaining a structure of a single memory cell 40 corresponding to a single memristor device according to an example embodiment.

Referring to FIG. 4A, the single memory cell 40 may correspond to a single memristor device for realizing each of synapses included in a 3D stacked synaptic structure of a neuromorphic apparatus according to an example embodiment.

A memory cell region 400 of the single memory cell 40 may have a structure in which a first metal (metal 1) 401 is disposed on a lowest side of the memory cell region 400, and a ferroelectric (or a ferroelectric film) 402, an insulator 403, and a second metal (metal 2) 404 are sequentially stacked in the stated order from an upper side of the first metal (metal 1) 401. Here, a semiconductor film may be used instead of the insulator 403.

The first metal (metal 1) 401 may be one metal selected from the group consisting of TiN, Al, Zr, La, Y, Ti, and W, and may correspond to a first electrode (electrode 1). The second metal (metal 2) 404 may be one metal selected from the group consisting of TiN, Al, Zr, La, Y, Ti, and W, and may correspond to a second electrode (electrode 2). The insulator 403 may be one material selected from the group consisting of $Al_2O_3$, $SiO_2$, and $Si_3N_4$. The ferroelectric 402 may be HfO doped with any one or any combination of Si, Zr, Y, Al, Gd, Sr, and La. However, the materials are examples for realizing the stack structure of the single memory cell 40, and thus, are not limited thereto.

In the single memory cell 40, a word line 410 (WL) is disposed on a lower side of the first metal (metal 1) 401 of the memory cell region 400, and a bit line 420 (BL) is disposed on an upper side of the second metal (metal 2) 404 of the memory cell region 400. Here, the word line 410 may include a different material from or the same material as that of the first metal (metal 1) 401, and the bit line 420 may include a different material from or the same material as that of the second metal (metal 2) 404.

In the memory cell region 400, a first potential barrier height between the second metal (metal 2) 404 and the insulator 403 is greater than a second potential barrier height between the first metal (metal 1) 401 and the ferroelectric 402. Also, in the memory cell region 400, a first dielectric constant of the insulator 403 is less than a second dielectric constant of the ferroelectric 402. Accordingly, in the memory cell region 400, the first metal (metal 1) 401, the ferroelectric 402, the insulator 403, the second metal (metal 2) 404 respectively may include materials that satisfy the above conditions.

Figure 4B:
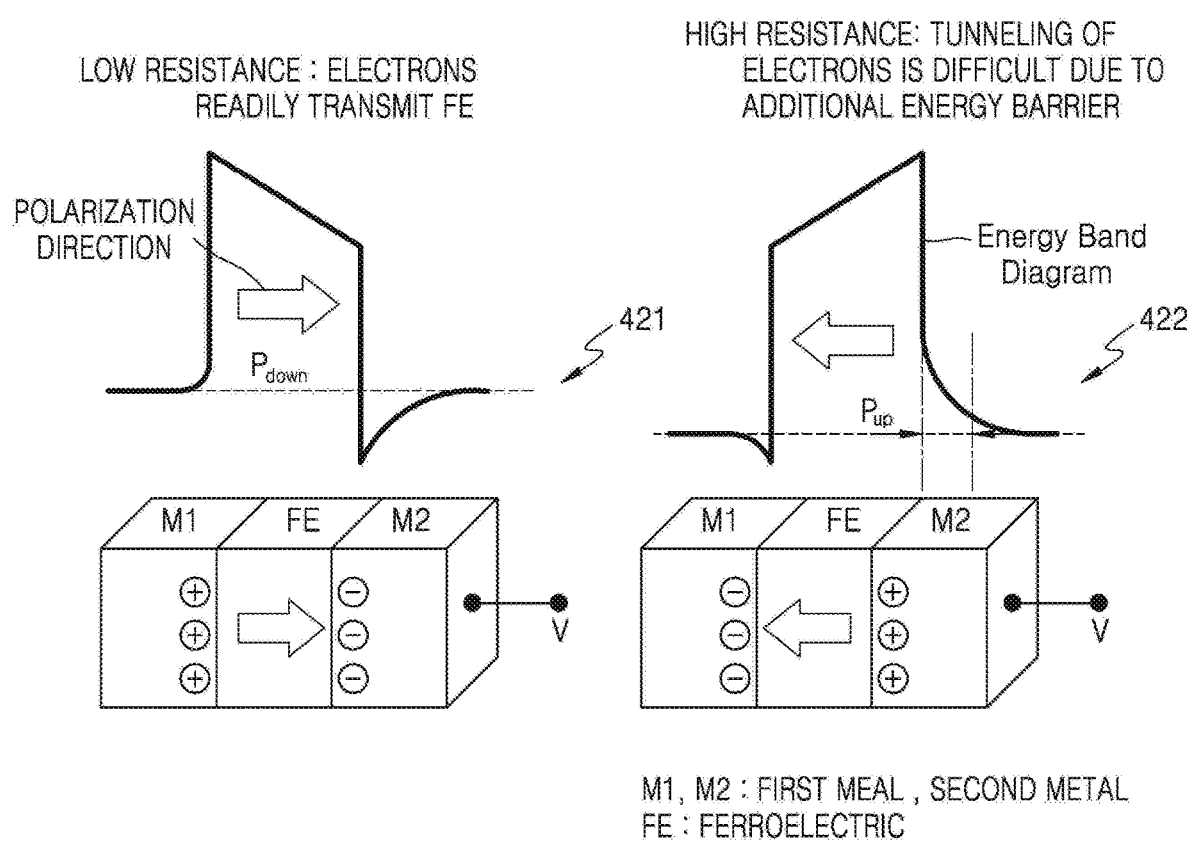
FIG. 4B is a diagram for explaining the principle of writing digital values in a ferroelectric tunnel junction (FTL) device using a ferroelectric according to an example embodiment.

FIG. 4B is a diagram for explaining a principle of writing digital values in a ferroelectric tunnel junction (FTL) device using a ferroelectric according to an example embodiment.

Referring to FIG. 4B, the FTL device has a characteristic in which, when a voltage is applied to the FTL device, a direction of polarization P of ions is changed according to locations of the ions, and the polarization P is maintained after the voltage is removed, and thus, the FTL device may be used as a non-volatile memory device.

When a voltage is applied to the FTL device in which a first metal M1, a ferroelectric FE, and a second metal M2 are joined as a polarization direction $P_{down}$ indicated by an arrow, the FTL device is in a low resistance state 421. At this point, electrons may easily transmit the ferroelectric FE between the first metal M1 and the second metal M2. The low resistance state 421 of the FTL device may be used as a digital value '0'.

However, when a voltage is applied to the FTL device as a polarization direction $P_{up}$ indicated by an arrow, the FTL device is in a high resistance state 422. At this point, electrons may not transmit the ferroelectric FE, and thus, electron tunneling may be difficult due to an energy barrier between the first metal M1 and the second metal M2. The high resistance state 422 may be used as a digital value '1'. That is, the FTL device may express different digital values according to the two polarization states.

Figure 5:
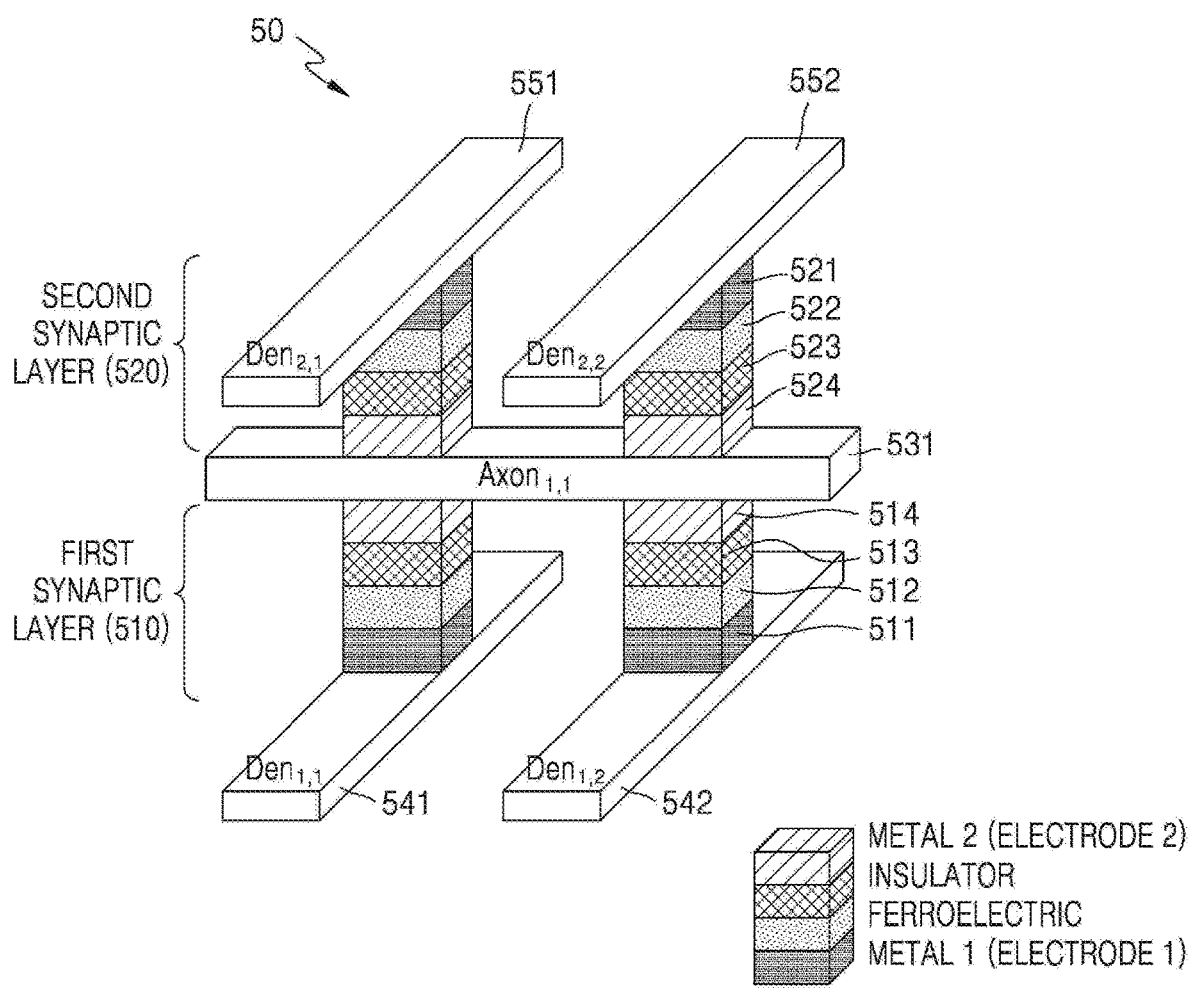
FIG. 5 is a diagram for explaining a synaptic sub-module for realizing synapses of a neuromorphic apparatus having a three-dimensionally (3D) stacked synaptic structure according to an example embodiment.

FIG. 5 is a diagram for explaining a synaptic sub-module 50 for realizing synapses of a neuromorphic apparatus having a three-dimensionally (3D) stacked synaptic structure according to an example embodiment.

Referring to FIG. 5, the synaptic sub-module 50 may have a 3D stacked structure having two symmetrical memristers respectively realized by the single memory cell 40 of FIG. 4A. In detail, the synaptic sub-module 50 may have a stack structure in which a first synaptic layer 510 and a second synaptic layer 520 are stacked.

The first synaptic layer 510 includes memrister arrays having a first stack structure, and includes word lines respectively on lower sides of the memrister arrays and a bit line on upper sides of the memrister arrays. Here, each of the memristers having the first stack structure may be a memory cell having a stack structure as the single memory cell 40 of FIG. 4A. That is, like the single memory cell 40 of FIG. 4A, the first stack structure may denote a stack structure in which a first metal (or a first electrode) 511, a ferroelectric 512, an insulator 513, and a second metal (or a second electrode) 514 are sequentially stacked in the stated order from a lower side of the first synaptic layer 510. For convenience of explanation, only two memory cells are depicted in FIG. 5. However, the first synaptic layer 510 may include an array having more than two memristers.

In the first synaptic layer 510, the bit line corresponds to an axon line ($Axon_{1,1}$) 531 of a neural network, and the word lines respectively may correspond to dendrite lines ($Den_{1,1}$ and $Den_{1,2}$) 541 and 542 of the neural network.

The second synaptic layer 520 may include: an array of memristers that are stacked on the first synaptic layer 510 and have a second stack structure that is opposite to the first stack structure; a bit line on a lower side of the array of memristers; and word lines respectively on an upper side of the array of memristers.

The second stack structure is opposite to the first stack structure, and thus, the memristers included in the second synaptic layer 520 may be formed as a structure in which a second metal 524, an insulator 523, a ferroelectric 522, and a first metal 521 are sequentially formed from bottoms of the memristers towards upwards. That is, the stack structure (the second stack structure) of the memristers of the second synaptic layer 520 is symmetrical to the stack structure (the first stack structure) of the memristers of the first synaptic layer 510.

In the second synaptic layer 520, the bit line corresponds to the axon line ($Axon_{1,1}$) 531, and the word lines respectively correspond to dendrite lines ($Den_{2,1}$ and $Den_{2,2}$) 551 and 552. That is, the first synaptic layer 510 and the second synaptic layer 520 may share the axon line ($Axon_{1,1}$) 531. In a circuit configuration of a neuromorphic apparatus, the dendrite lines ($Den_{1,1}$, $Den_{1,2}$, $Den_{2,1}$ and, $Den_{2,2}$) 541, 542, 551, and 552 may correspond to lines that connect, for example, the synapse circuits 22 (refer to FIG. 2) and the neuron circuits 24 (refer to FIG. 2).

The synaptic sub-module 50 may correspond to a partial structure of a unit synaptic module for realizing a 3D stacked synaptic structure of a neuromorphic apparatus. The unit synaptic module will be described in detail below with reference to FIG. 6.

Figure 6:
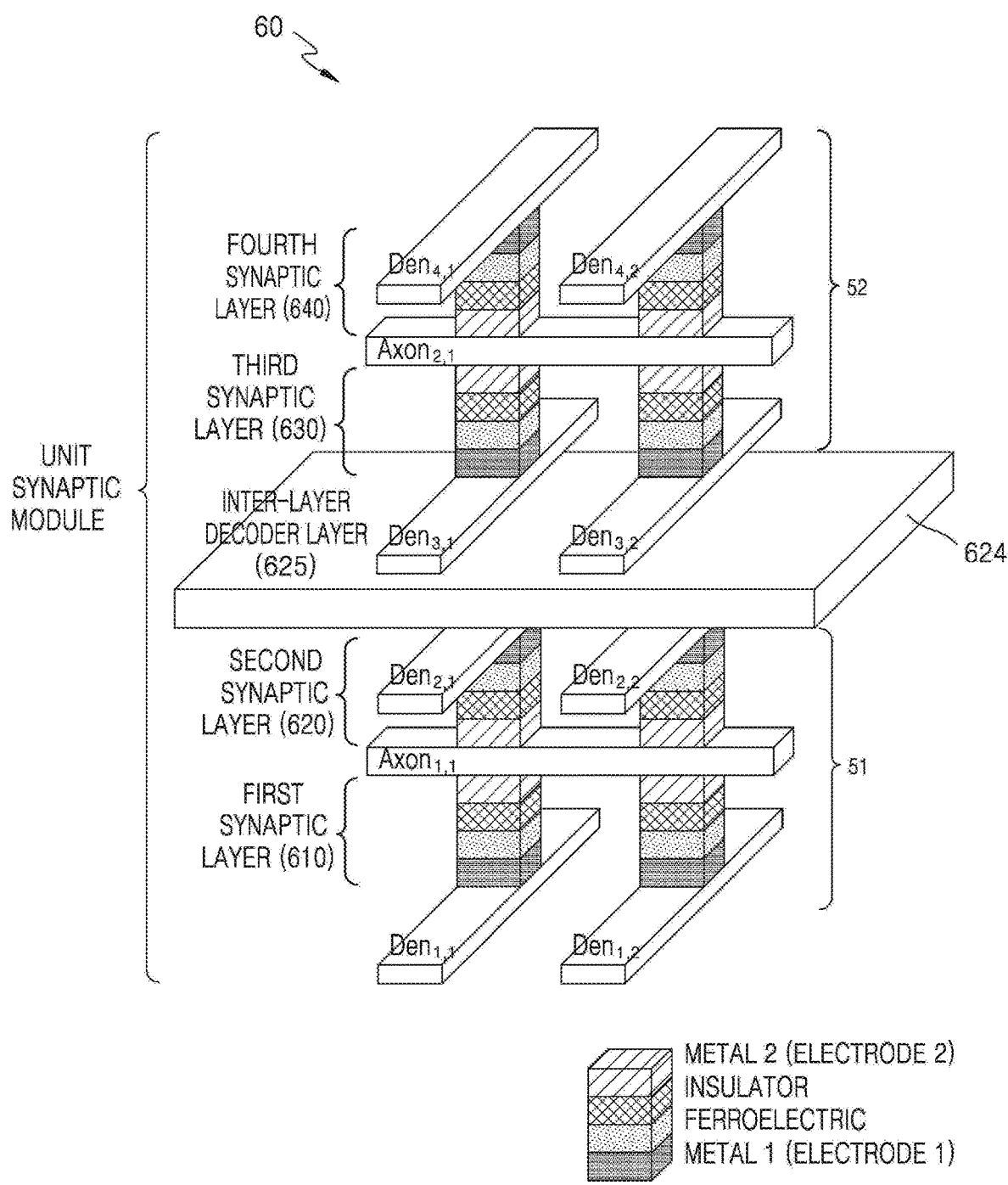
FIG. 6 is a diagram for explaining an unit synaptic module in a 3D stacked synaptic structure of a neuromorphic apparatus according to an example embodiment.

FIG. 6 is a diagram for explaining a unit synaptic module 60 in a 3D stacked synaptic structure of a neuromorphic apparatus according to an example embodiment.

Referring to FIG. 6, the neuromorphic apparatus may include a plurality of unit synaptic modules that are sequentially stacked. The unit synaptic module 60 may be formed by sequentially stacking: a first synaptic module 51 having the synaptic sub-module 50 described with reference to FIG. 5; an interlayer decoder (a first decoder) 624 for selecting a specific unit synaptic module 60 of a plurality of unit synaptic modules; and a second synaptic module 52 having the synaptic sub-module 50 described with reference to FIG. 5. Here, the term 'unit synaptic module' is defined in the present embodiment for convenience of explanation, and thus, may be substituted by another term.

In detail, the unit synaptic module 60 includes: a first synaptic layer 610 including an array of memristors having a first stack structure; a second synaptic layer 620 that is stacked on the first synaptic layer 610 and includes an array of memristors having a second stack structure; an interlayer decoder layer (a first decoder layer) 625 including an interlayer decoder 624; a third synaptic layer 630 that is stacked on the interlayer decoder layer (the first decoder layer) 625 and includes an array of memristors having the first stack structure; and a fourth synaptic layer 640 that is stacked on the third synaptic layer 630 and includes an array of memristors having the second stack structure.

In the unit synaptic module 60, a lower synaptic layer (the first synaptic layer 610) of neighboring synaptic layers (for example, the first synaptic layer 610 and the second synaptic layer 620) includes an array of memristors having the first stack structure and an upper synaptic layer (the second synaptic layers 620) includes an array of memristors having the second stack structure. As described with reference to FIG. 5, the memristors having the first stack structure may correspond to a memory cell in which a first metal, a ferroelectric, an insulator, and a second metal are sequentially stacked, and the second stack structure denotes a stack structure completely opposite to the first stack structure.

Also, in the unit synaptic module 60, the lower synaptic layer (the first synaptic layer 610) includes word lines $Den_{1,1}$ and $Den_{1,2}$ on a lower side of the lower synaptic layer and a bit line $Axon_{1,1}$ on an upper side of the lower synaptic layer, and the upper synaptic layer (the second synaptic layer 620) includes the bit line $Axon_{1,1}$ on a lower side of the upper synaptic layer and word lines $Den_{2,1}$ and $Den_{2,2}$ on an upper side of the upper synaptic layer.

In FIG. 6, for convenience of explanation, it is depicted that each of the first through fourth synaptic layers 610, 620, 630, and 640 includes only two memory cells. However, each of the first through fourth synaptic layers 610, 620, 630, and 640 may include a memristor array including more than two memristors.

Figure 7:
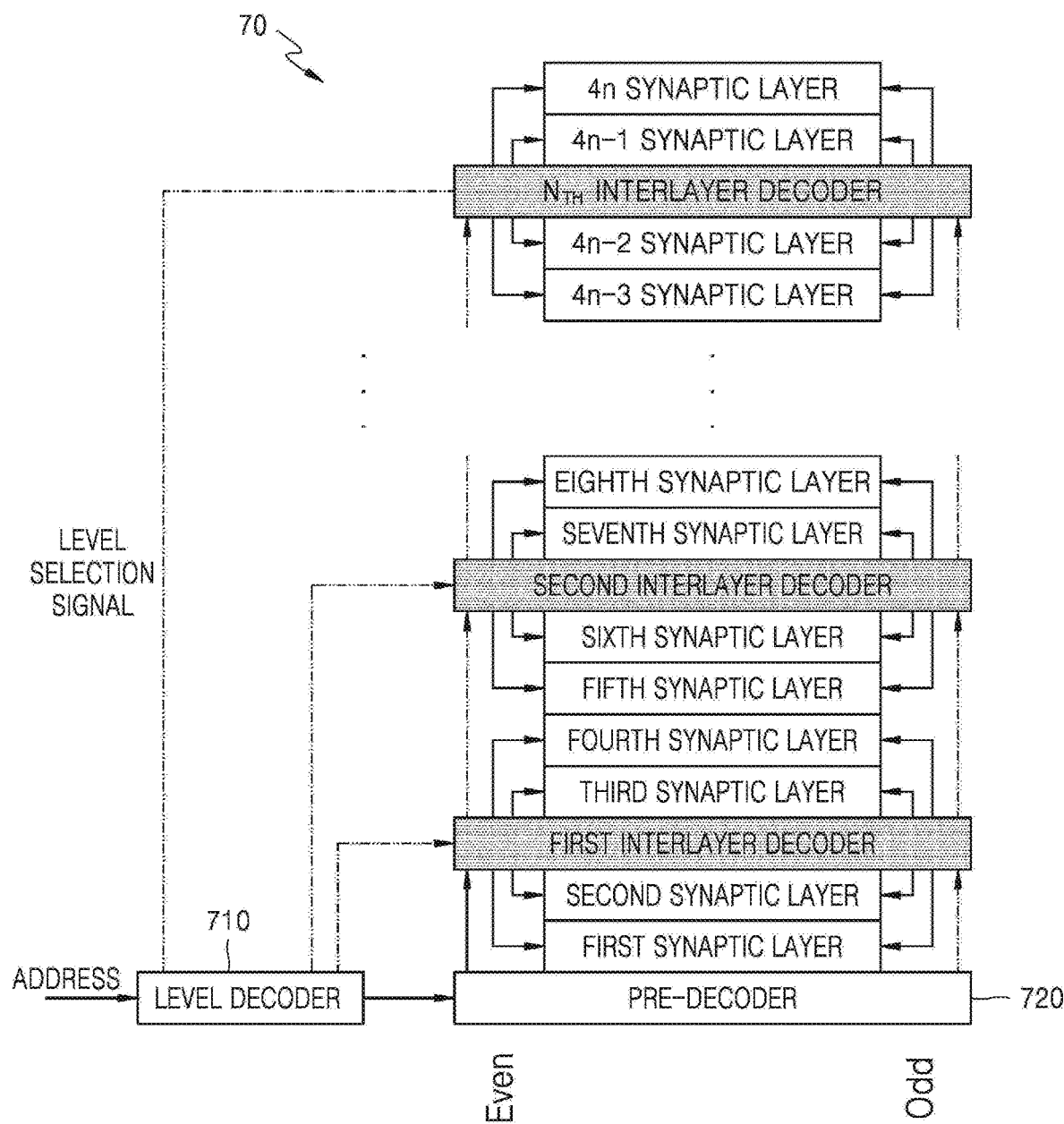
FIG. 7 is a diagram for explaining a 3D stacked synaptic structure of a neuromorphic apparatus according to an example embodiment.

FIG. 7 is a diagram for explaining a 3D stacked synaptic structure 70 of a neuromorphic apparatus according to an example embodiment.

Referring to FIG. 7, the 3D stacked synaptic structure 70 may be realized by three-dimensionally stacking n number of the unit synaptic modules 60 described with reference to FIG. 6. For example, a group of first through fourth synaptic layers and a first interlayer decoder may correspond to the unit synaptic module 60 of FIG. 6, and a group of $4_{n-3}$ through $4_n$ synaptic layers and an $n_{th}$ interlayer decoder may correspond to the unit synaptic module 60 of FIG. 6 (n is a natural number).

That is, the 3D stacked synaptic structure 70 of a neuromorphic apparatus includes a plurality of unit synaptic modules that each include a plurality of stacked synaptic layers and an interlayer decoder stacked between some of the synaptic layers of the synaptic layers. As described with reference to FIGS. 5 and 6, in each of the unit synaptic modules, memristors included in neighboring synaptic layers have a symmetrical stacking structure from each other.

Additionally, the 3D stacked synaptic structure 70 may include a level decoder (a second decoder) 710 that provides a level selection signal to an interlayer decoder included in a specific unit synaptic module to be accessed from among a plurality of unit synaptic modules and a pre-decoder (a third decoder) 720 that generates an address of a specific memrister to be accessed in a memrister array of synaptic layers included in specific unit synaptic module to be accessed. As an example, a plurality of unit synaptic modules may be stacked on a pre-decoder layer including the pre-decoder 720 in the 3D stacked synaptic structure 70.

Figure 8:
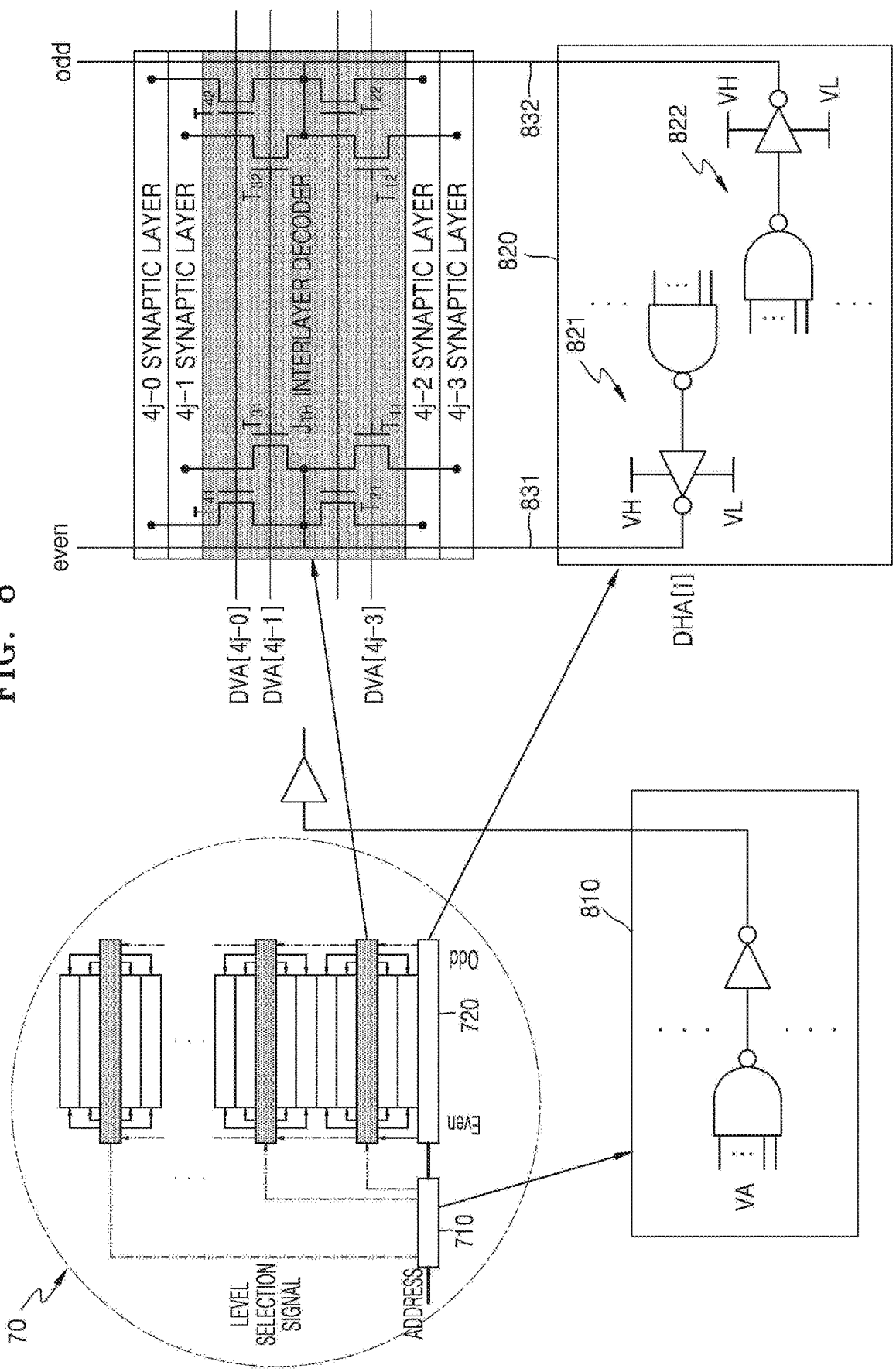
FIG. 8 is a diagram for explaining an operation of decoders in a 3D stacked synaptic structure of a neuromorphic apparatus according to an example embodiment.

FIG. 8 is a diagram for explaining an operation of decoders in the 3D stacked synaptic structure 70 of a neuromorphic apparatus according to an example embodiment.

Referring to FIG. 8, the 3D stacked synaptic structure 70 of a neuromorphic apparatus may include three kinds of decoders (an interlayer decoder, a level decoder, and a pre-decoder).

The interlayer decoder (a j interlayer decoder, where j is a natural number) may include a plurality of transistor switches $T_{11}$, $T_{12}$, $T_{21}$, $T_{22}$, $T_{31}$, $T_{32}$, $T_{41}$, and $T_{42}$ for receiving a level selection signal from the level decoder 710.

A circuit 810 of the level decoder 710 is connected to an interlayer decoder of each of the unit synaptic modules through lines, and selects a specific unit synaptic module by transmitting a level selection signal (data vertical address (DVA)) to the interlayer decoder (the j interlayer decoder) of the unit synaptic module to be accessed and a specific synaptic layer in the specific unit synaptic module. That is, the level selection signal may be a signal for selecting a unit synaptic module to be accessed and a synaptic layer to be accessed of the synaptic layers included in the unit synaptic module to be accessed.

In detail, a level selection signal transmitted from the circuit 810 of the level decoder 710 includes information (DVA[4j−3], DVA[4j−2], DVA[4j−1], or DVA[4j−b 0]) regarding which one of the synaptic layers will be selected (that is, one of a 4j−3 synaptic layer through a 4j−0 synaptic layer) in the specific unit synaptic module. As a result, the level decoder 710 controls the access to a memrister array of a corresponding synaptic layer by turning on the transistor switches $T_{11}$, $T_{12}$, $T_{21}$, $T_{22}$, $T_{31}$, $T_{32}$, $T_{41}$, and $T_{42}$ included in the interlayer decoder (a j interlayer decoder) in the specific unit synaptic module by using the transmitted level selection signal.

The pre-decoder 720 generates an address signal (data horizontal address (DHA)) corresponding to an address of a memrister to be accessed of memrister arrays of a plurality of synaptic layers included in the specific unit synaptic module that is selected by the level decoder 710. In detail, the pre-decoder 720 generates a memrister address included in the specific synaptic layer in the specific unit synaptic module selected by the level selection signal of the level decoder 710.

According to the present example embodiment, a circuit 820 of the pre-decoder 720 may include a circuit 821 connected to row lines 831 of a memrister array and a circuit 822 connected to column lines 832 of the memrister array. The circuit 820 of the pre-decoder 720 generates a row line signal and a column line signal corresponding to an address for accessing to a memrister located on the address at a point where a specific row and a specific column cross each other.

In the related art, a selection device (for example, a p-i-n diode) is included in a memory cell (a memrister device). However, in the case when the memory cells including the selection device are three-dimensionally stacked, a selection device may be formed in each of the memory cells, and thus, the manufacturing process is complicated. Also, when the selection device is formed under a high temperature process, the memory cell and the selection device in a lower layer of a stack are damaged whenever the memory cell and the selection device are stacked, and thus, there is a problem that overall cell characteristics of the memory cell are degraded. Also, in the case of a memory device that uses a large writing current, the selection device also uses a writing current driving capacity greater than the writing current of the memory device, and accordingly, the size of the selection device is increased, thereby reducing the integrity of the 3D stacked synaptic structure 70. Furthermore, in the case of the 3D stacked structure of the related art, when memory cells are stacked more than a few layers, there is a problem of greatly increasing an area of a decoder peri-circuit for selecting a memory cell array of a specific layer beside the memory cell array.

However, in the 3D stacked synaptic structure 70 of the neuromorphic apparatus according to the present example embodiment, a decoder (that is, an interlayer decoder) for selecting a specific synaptic layer (that is, a memory cell array) is inserted between some synaptic layers, and thus, the problem of increasing the area of the peri-circuit is eased.

Figure 9:
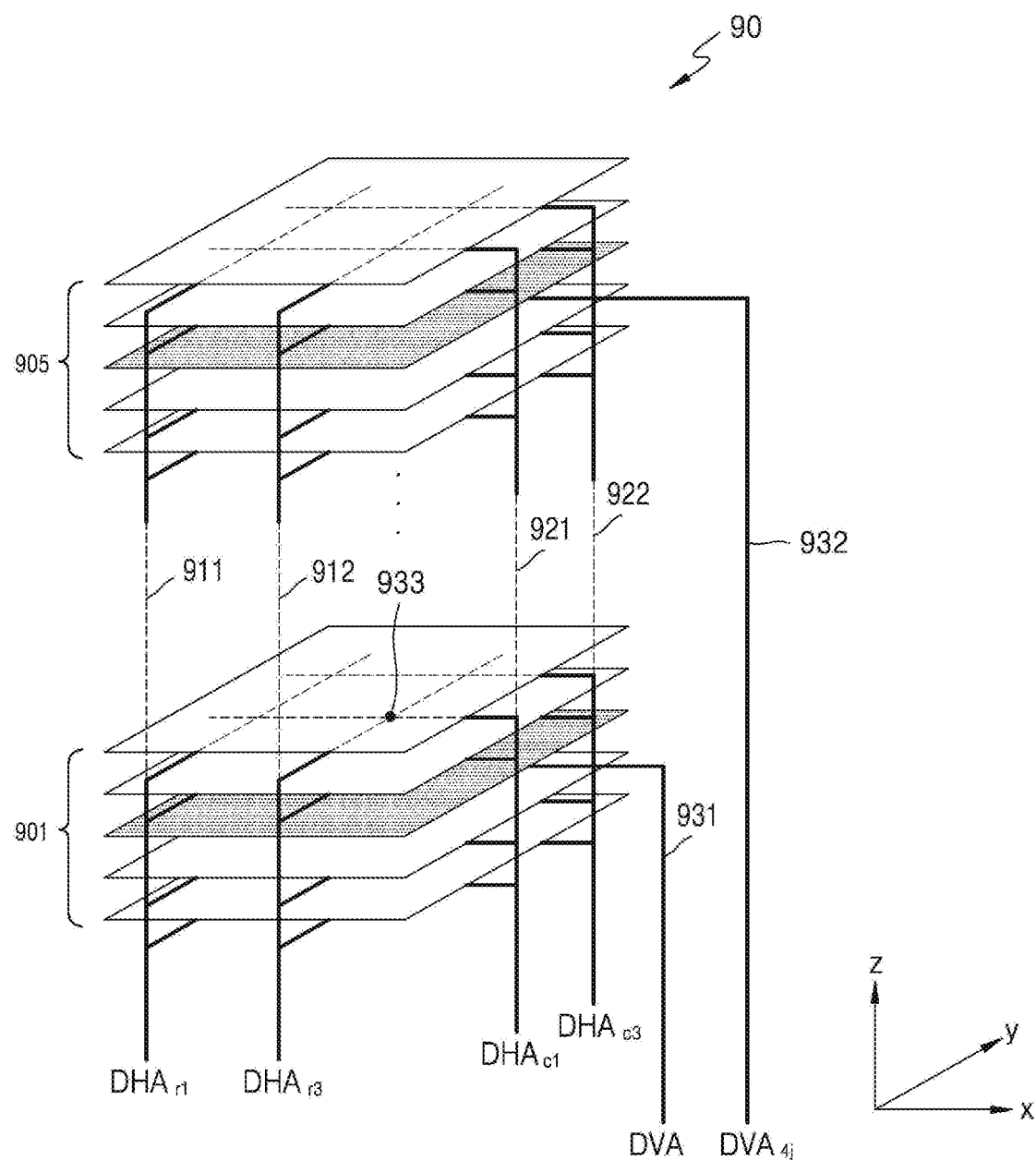
FIG. 9 is a diagram for explaining a line arrangement for accessing to a memrister in a 3D stacked synaptic structure of a neuromorphic apparatus according to an example embodiment.

FIG. 9 is a diagram for explaining a line arrangement for accessing a memrister in a 3D stacked synaptic structure 90 of a neuromorphic apparatus according to an example embodiment.

Referring to FIG. 9, in the 3D stacked synaptic structure 90 of a neuromorphic apparatus, each of the synaptic layers are briefly depicted. The 3D stacked synaptic structure 90 may include interlayer decoders respectively indicated as shadows in the center and a plurality of unit synaptic layers 901 and 905 in which two synaptic layers are stacked on an upper end and a lower end with respect to the interlayer decoder.

A level selection signal $DVA_1$ or $DVA_{4j}$ generated from the level decoder 710 may be transmitted through a line 931 or 932 connected between the level decoder 710 and interlayer decoders included in a unit synaptic module 901 or 905. In detail, the line 931 or 932 may include a number of sub-lines corresponding to the number of synaptic layers included in the unit synaptic module 901 or 905, or may include a demultiplex for selecting a specific synaptic layer between the synaptic layers included in the line 931 or 932 and the unit synaptic module 901 or 905. That is, the level selection signal may be transmitted through a sub-line included in the line 931 or 932 or be demultiplexed to turn on transistor switches connected to a synaptic layer to be accessed, and as a result, a corresponding synaptic layer may be accessed.

To access to a specific memrister included in a memrister array of a synaptic layer selected by a level selection signal of the level decoder 710, the pre-decoder 720 generates a row line signal and a column line signal. For convenience of explanation, in FIG. 9, it is assumed that an x-axis direction is a row direction of the memrister array and a y-axis direction is a column direction of the memrister array, but the present embodiment is not limited thereto.

The pre-decoder 720 is connected to a memrister array of each of the synaptic layers through the row lines 911 and 912 and column lines 921 and 922. The pre-decoder 720 generates a row line signal $DHA_{r1}$ or $DHA_{r3}$ and a column line signal $DHA_{c1}$ or $DHA_{c3}$ to select a memrister to be accessed in a memrister array included in the selected synaptic layer.

For example, when an access to a memrister 933 is to be had, the level decoder 710 transmits a level selection signal for selecting a synaptic layer including the memrister 933 to an interlayer decoder included in the unit synaptic module 901 through the line 931, and the pre-decoder 720 transmits the row line signal $DHA_{r3}$ and the column line signal $DHA_{c1}$ to a synaptic layer including the memrister 933 through the row line 912 and the column line 921.

In FIG. 9, for convenience of explanation, only the row lines 911 and 912 and the column lines 921 and 922 of odd numbered channels are depicted. However, although not shown in FIG. 9, row lines of even numbered channels may be present on an opposite side to the row lines 911 and 912 of the odd numbered channels in each synaptic layer, and also, column lines of even numbered channels may be present on an opposite side to the column lines 921 and 922 of the odd numbered channels in each synaptic layer. Alternatively, unlike as depicted in FIG. 9, lines of all channels (both add numbered and even numbered channels) may be provided on a side of the 3D stacked synaptic structure 90 without distinguishing the odd and even numbered channels.

The row lines 911 and 912 and column lines 921 and 922 respectively are connected to the word lines (for example, the dendrite lines) and the bit lines (for example, the axon lines) described above with reference to the drawings. In FIG. 9, for convenience of explanation, only the two row lines 911 and 912 and the two column lines 921 and 922 are depicted. However, in the 3D stacked synaptic structure 90 of the neuromorphic apparatus, more than two row lines and more than two column lines may be present.

Figure 10:
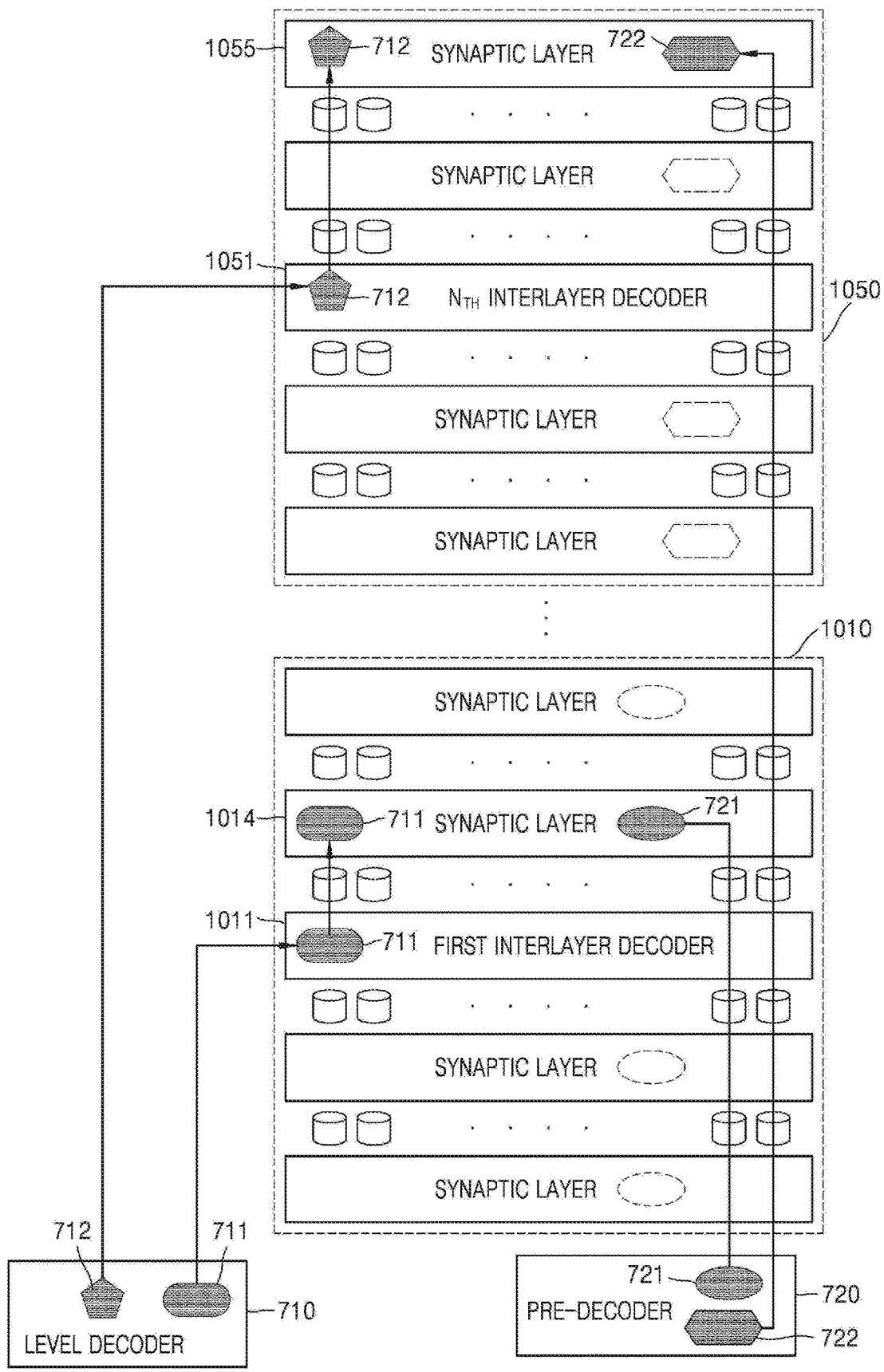
FIG. 10 is a diagram for explaining an operation of decoders for accessing to a memrister in a 3D stacked synaptic structure of a neuromorphic apparatus according to an example embodiment.

FIG. 10 is a diagram for explaining operations of decoders for accessing to a memrister in a 3D stacked synaptic structure of a neuromorphic apparatus according to an example embodiment.

First, a case of accessing to a memrister included in a synaptic layer 1014 will be described. The level decoder 710 transmits a level selection signal 711 to a first interlayer decoder 1011 to select the synaptic layer 1014 in a unit synaptic module 1010. The synaptic layer 1014 may be selected by the level selection signal 711 received by the first interlayer decoder 1011. The pre-decoder 720 transmits row/column signals 721 corresponding to a memrister address to the synaptic layer 1014, and thus, an access to a desired memrister may be implemented.

Next, a case of accessing to another memrister included in a synaptic layer 1055 will be described. The level decoder 710 transmits a level selection signal 712 to an $n_{th}$ interlayer decoder 1051 to select the synaptic layer 1055 in a unit synaptic module 1050. The synaptic layer 1055 may be selected by the level selection signal 712 received by the $n_{th}$ interlayer decoder 1051. The pre-decoder 720 transmits row/column signals 722 corresponding to a memrister address to the synaptic layer 1055, and thus, an access to a desired another memrister may be implemented.

Figure 11:
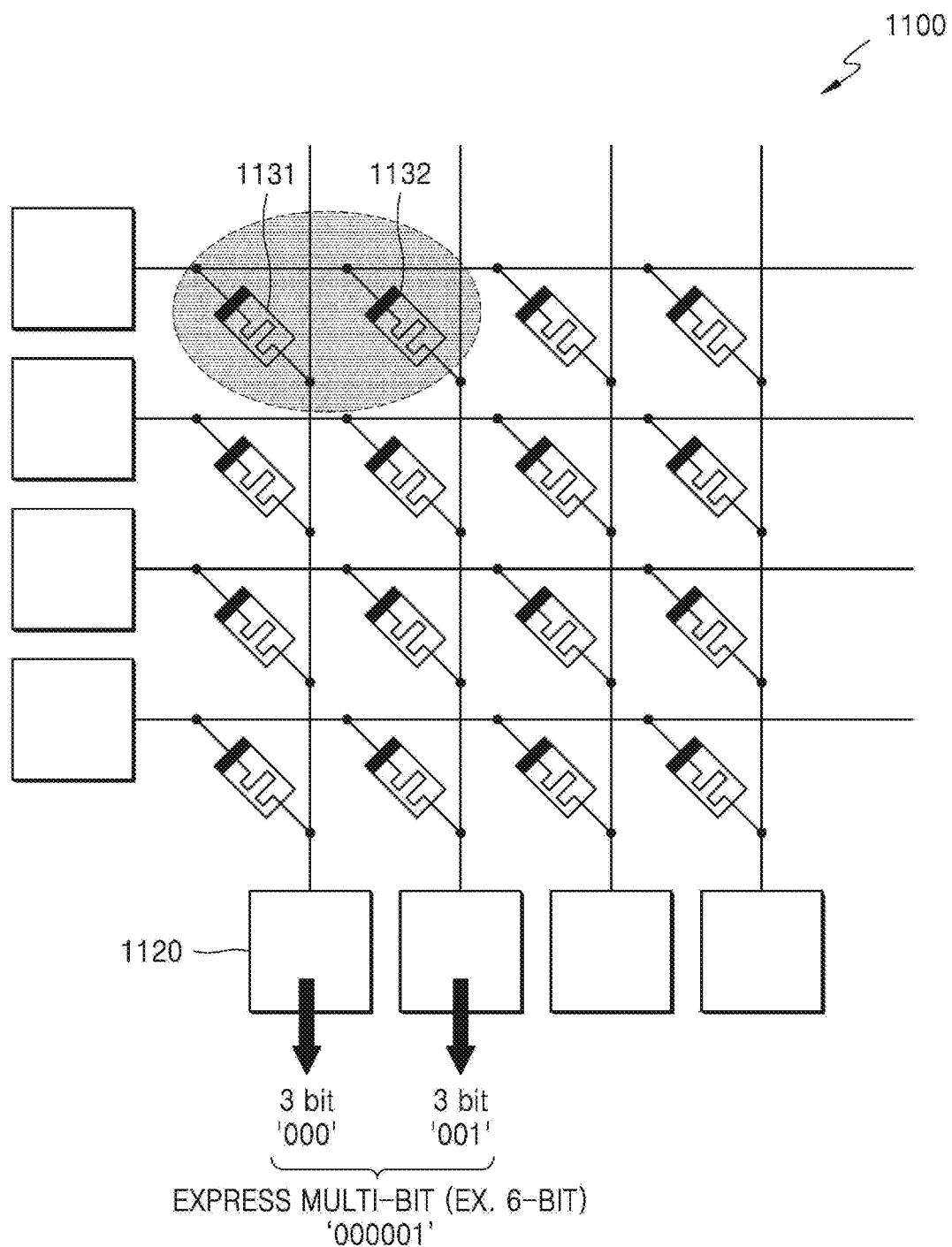
FIG. 11 is a diagram for explaining a method of expressing a multi-bit synaptic value by using multiple memristers according to an example embodiment.

FIG. 11 is a diagram for explaining a method of expressing a multi-bit synaptic value by using a plurality of memristers according to an example embodiment.

Referring to FIG. 11, a multi-bit synaptic value may be expressed by grouping two memristers 1131 and 1132 to a single synapse in a neuromorphic apparatus 1100. For example, in the case when the two memristers 1131 and 1132 respectively are 3 bit memory devices, a synaptic value of total 6 bits ($2^6$=64 level) may be expressed by grouping the two memristers 1131 and 1132. Here, the memrister 1131 may be set to have a 3 bit MSB of a 6 bit synaptic value and the memrister 1132 may be set to have a 3 bit LSB of a 6 bit synaptic value.

For example, when a digital value of '000' is written in the memrister 1131 and a digital value of '001' is written in the memrister 1132 to express a synaptic value of '2', a 6 bit expression of '000001' is possible in neurons 1120.

To express a multi-bit synaptic value, memristers to be grouped may be memristers different from each other included in a single synaptic layer or may be memristers different from each other included in different synaptic layers from each other.

In FIG. 11, for convenience of explanation, it is depicted as that the two memristers 1131 and 1132 are grouped, but the present embodiment is not limited thereto. Bit expressions of various lengths may be possible by grouping two or more memristers.

FIG. 12 is a flow chart of a method of operating a neuromorphic apparatus having a 3D stacked synaptic structure according to an example embodiment.

Referring to FIG. 12, the method of operating the neuromorphic apparatus includes time series operations processed in the neuromorphic apparatuses depicted in FIGS. 2 through 10. Accordingly, even though the descriptions that are omitted below, the descriptions made above with respect to the neuromorphic apparatuses in FIGS. 2 through 10 may be applied to the operation of the neuromorphic apparatus of FIG. 12.

In operation 1201, the level decoder provides a level selection signal to an interlayer decoder included in a unit synaptic module to be accessed of a plurality of unit synaptic modules including synaptic layers each including a plurality of stacked layers and an interlayer decoder stacked between some synaptic layers of the synaptic layers. Here, in each of the unit synaptic modules, memristers included in neighboring synaptic layers have stack structures symmetrical to each other.

In operation 1202, the pre-decoder generates an address of a memrister to be accessed in a memrister array of the synaptic layers included in the unit synaptic modules to which a level selection signal is provided.

In operation 1203, an access with respect to a memrister corresponding to the generated address is performed.

The neuromorphic apparatus described above may be referred to as a term, such as a memory device or a semiconductor device because the neuromorphic apparatus includes memory devices like a plurality of memristers. Also, the synaptic layers may be referred to as a memory layer or a semiconductor layer because the synaptic layers realized in the neuromorphic apparatus include a memrister array. Furthermore, the terms, such as the unit synaptic module, a synaptic module, and a synaptic sub-module respectively may be referred to as a unit memory module (or a unit semiconductor module), a memory module (or a semiconductor module), and a memory sub-module (or a semiconductor sub-module). That is, it will be understood by those of ordinary skill in the art that the terms described in the present embodiments may be referred to as various other terms.

Embodiments of the disclosure may be implemented as a computer-readable program, and may be realized in computers that execute the program by using non-transitory computer-readable recording media. data structures used in the present embodiments may be recorded the recording media through various ways. The computer-readable medium may be magnetic storage media (e.g., ROM, floppy disks, hard disks, etc.) and optical recording media (e.g., CD-ROMs or DVDs), and transmission media such as Internet transmission media.

While this disclosure has been shown and described with reference to embodiments thereof, it will be understood by those of ordinary skill in the art that various changes in form and details may be made therein without departing from the spirit and scope of the disclosure as defined by the appended claims. The embodiments may be considered in descriptive sense only and not for purposes of limitation. Therefore, the scope of the disclosure is defined not by the detailed description of the disclosure but by the appended claims, and all differences within the scope will be construed as being included in the disclosure.

What is claimed is:

1. A neuromorphic apparatus comprising a three-dimensionally-stacked synaptic structure, the neuromorphic apparatus comprising:
    a plurality of unit synaptic modules, each of the plurality of unit synaptic modules comprising a plurality of synaptic layers, each of the plurality of synaptic layers comprising a plurality of stacked layers, and each of the plurality of unit synaptic modules further comprising a first decoder interposed between two among the plurality of synaptic layers;
    a second decoder that provides a level selection signal to the first decoder included in one among the plurality of unit synaptic modules to be accessed; and
    a third decoder that generates an address of one among a plurality of memristers to be accessed in a memrister array of one among the plurality of synaptic layers included in the one among the plurality of unit synaptic modules to be accessed,
    wherein, in each of the plurality of unit synaptic modules, neighboring memristers included in neighboring synaptic layers have a plurality of stack structures symmetrical to each other.

2. The neuromorphic apparatus of claim 1, wherein each of the plurality of unit synaptic modules comprises:
    a first synaptic layer comprising a first array of first memristers, each of the first memristers having a first stack structure;
    a second synaptic layer disposed on the first synaptic layer, and comprising a second array of second memristers, each of the second memristers having a second stack structure;
    a third synaptic layer comprising a third array of third memristers, each of the third memristers having the first stack structure; and
    a fourth synaptic layer disposed on the third synaptic layer, and comprising a fourth array of fourth memristers, each of the fourth memristers having the second stack structure,
    wherein the first decoder is interposed between the second synaptic layer and the third synaptic layer.

3. The neuromorphic apparatus of claim 1, wherein a lower synaptic layer of the neighboring synaptic layers comprises a first array of first memristers, each of the first memristers having a first stack structure,
    wherein an upper synaptic layer of the neighboring synaptic layers comprises a second array of second memristers, each of the second memristers having a second stack structure,
    wherein each of the first memristers having the first stack structure comprises a first memory cell, the first memory cell comprising a first metal, a ferroelectric disposed on the first metal, an insulator disposed on the ferroelectric, and a second metal disposed on the ferroelectric, and
    wherein each of the second memristers having the second stack structure comprises a second memory cell, the second memory cell comprising the second metal, the insulator disposed on the second metal, the ferroelectric disposed on the insulator, and the first metal disposed on the ferroelectric.

4. The neuromorphic apparatus of claim 3, wherein the lower synaptic layer comprises a first word line on which the first array of the first memristers is disposed, and a first bit line disposed on the first array of the first memristers, and
wherein the upper synaptic layer comprises the first bit line on which the second array of the second memristers is disposed, and a second word line disposed on the second array of the second memristers.

5. The neuromorphic apparatus of claim 4, wherein the first bit line corresponds to an axon of a neural network, and the first word line and the second word line respectively correspond to dendrites of the neural network.

6. The neuromorphic apparatus of claim 3, wherein a first potential barrier height between the second metal and the insulator is greater than a second potential barrier height between the first metal and the ferroelectric.

7. The neuromorphic apparatus of claim 3, wherein a first dielectric constant of the insulator is less than a second dielectric constant of the ferroelectric.

8. The neuromorphic apparatus of claim 3, wherein the first metal is one selected from a group consisting of TiN, Al, Zr, La, Y, Ti, and W,
wherein the second metal is one selected from a group consisting of TiN, Al, Zr, La, Y, Ti, and W,
wherein the insulator is one selected from a group consisting of $Al_2O_3$, $SiO_2$, and $Si_3N_4$, and
wherein the ferroelectric is HfO doped with any one or any combination of Si, Zr, Y, Al, Gd, Sr, and La.

9. The neuromorphic apparatus of claim 1, wherein the plurality of unit synaptic modules are disposed on the third decoder.

10. The neuromorphic apparatus of claim 9, wherein the third decoder generates a row line signal and a column line signal that correspond to the address of the one among the plurality of memristers.

11. The neuromorphic apparatus of claim 1, wherein the level selection signal is for selecting the one among the plurality of unit synaptic modules to be accessed and the one among the plurality of synaptic layers to be accessed.

12. A memory device having a three-dimensionally-stacked synaptic structure, the memory device comprising:
a plurality of unit memory modules, each of the plurality of unit memory modules comprising a plurality of memory layers, each of the plurality of memory layers comprising a plurality of stacked layers, and each of the plurality of unit memory modules further comprising a first decoder interposed between two among of the plurality of memory layers;
a second decoder that provides a level selection signal to the first decoder included in one among the plurality of unit memory modules to be accessed; and
a third decoder that generates an address of one among a plurality of memory cells to be accessed in a memory cell array of one among the plurality of memory layers included in in the one among the plurality of unit memory modules to be accessed,
wherein, in each of the plurality of unit memory modules, neighboring memory cells included in neighboring memory layers have a plurality of stack structures symmetrical to each other.

13. The memory device of claim 12, wherein each of the plurality of unit memory modules comprises:
a first memory layer comprising a first array of first memory cells, each of the first memory cells having a first stack structure;
a second memory layer disposed on the first memory cells, and comprising a second array of second memory cells, each of the second memory cells having a second stack structure;
a third memory layer comprising a third array of third memory cells, each of the third memory cells having the first stack structure; and
a fourth memory layer disposed on the third memory layer, and comprising a fourth array of fourth memory cells, each of the fourth memory cells having the second stack structure,
wherein the first decoder is interposed between the second memory layer and the third memory layer.

14. The memory device of claim 12, wherein a lower memory layer of the neighboring memory layers comprises a first array of first memory cells, each of the first memory cells having a first stack structure,
wherein an upper memory layer of the neighboring memory layers comprises a second array of second memory cells, each of the second memory cells having a second stack structure,
wherein each of the first memory cells having the first stack structure comprises a first metal, a ferroelectric disposed on the first metal, an insulator disposed on the ferroelectric, and a second metal disposed on the ferroelectric, and
wherein each of the second memory cells having the second stack structure comprises the second metal, the insulator disposed on the second metal, the ferroelectric disposed on the insulator, and the first metal disposed on the ferroelectric.

15. The memory device of claim 14, wherein the lower memory layer comprises a first word line on which the first array of the first memory cells is disposed, and a first bit line disposed on the first array of the first memory cells, and
wherein the upper memory layer comprises the first bit line on which the second array of the second memory cells is disposed, and a second word line disposed on the second array of the second memory cells.

16. The memory device of claim 14, wherein a first potential barrier height between the second metal and the insulator is greater than a second potential barrier height between the first metal and the ferroelectric, and
a first dielectric constant of the insulator is less than a second dielectric constant of the ferroelectric.

17. A method of operating a neuromorphic apparatus having a three-dimensionally-stacked synaptic structure, the method comprising:
providing a level selection signal to a first decoder included in one among a plurality of unit synaptic modules to be accessed, each of the plurality of unit synaptic modules comprising a plurality of synaptic layers, each of the plurality of synaptic layers comprising a plurality of stacked layers, and each of the plurality of unit synaptic modules further comprising the first decoder interposed between two among the plurality of synaptic layers;
generating an address of one among a plurality of memristers to be accessed in a memrister array of one among the plurality of synaptic layers included in the one among the plurality of unit synaptic modules to which the level selection signal is provided; and
accessing the one among the plurality of memristers corresponding to the generated address,
wherein, in each of the plurality of unit synaptic modules, neighboring memristers included in neighboring synaptic layers have a plurality of stack structures symmetrical to each other.

18. A synaptic module of a neuromorphic apparatus having a three-dimensionally-stacked synaptic structure, the synaptic module comprising:

a first synaptic layer comprising a plurality of first stack structures, each of the plurality of first stack structures comprising a first memory cell, and a first word line on which the first memory cell is disposed;

a second synaptic layer comprising a plurality of second stack structures, each of the plurality of second stack structures comprising a second memory cell, and a second word line disposed on the second memory cell; and a bit line provided between the first synaptic layer and the second synaptic layer, wherein the first memory cell comprises a first metal that is directly disposed on the first word line, a second metal that is directly disposed on the bit line, and a ferroelectric and an insulator that are disposed between the first metal and the second metal, wherein the first metal, the ferroelectric, the insulator, and the second metal are stacked in an order of the first metal, the ferroelectric, the insulator, and the second metal, and wherein the second memory cell comprises the first metal disposed on the second word line, the second metal disposed on the bit line, the insulator and the ferroelectric that are disposed between the first metal and the second metal.

19. The synaptic module of claim 18, wherein a first potential barrier height between the second metal and the insulator is greater than a second potential barrier height between the first metal and the ferroelectric, and a first dielectric constant of the insulator is less than a second dielectric constant of the ferroelectric.

20. The synaptic module of claim 18, wherein the neuromorphic apparatus comprises a plurality of unit synaptic modules, wherein each of the plurality of unit synaptic modules comprises a first synaptic module having a structure of the synaptic module, a first decoder for selecting one of the plurality of unit synaptic modules, and a second synaptic module having the structure of the synaptic module, and wherein the first decoder is interposed between the first synaptic module and the second synaptic module.

* * * * *